US010908655B2

(12) United States Patent
Farington

(10) Patent No.: US 10,908,655 B2
(45) Date of Patent: Feb. 2, 2021

(54) STORAGE AND LABELING SYSTEM FOR A USB FLASH DRIVE

(71) Applicant: Kim Farington, Fairfax Station, VA (US)

(72) Inventor: Kim Farington, Fairfax Station, VA (US)

(*) Notice: Subject to any disclaimer, the term of this patent is extended or adjusted under 35 U.S.C. 154(b) by 70 days.

(21) Appl. No.: 15/066,035

(22) Filed: Mar. 10, 2016

(65) Prior Publication Data
US 2017/0262027 A1    Sep. 14, 2017

(51) Int. Cl.
*G06F 1/18* (2006.01)
*G11C 16/04* (2006.01)

(52) U.S. Cl.
CPC .............. *G06F 1/181* (2013.01); *G11C 16/04* (2013.01)

(58) Field of Classification Search
CPC .......... G06F 1/181; G06F 1/16; G06F 1/1613; G06F 3/0688; G06F 1/1684; G11C 16/04; A45C 13/02; A45C 2013/025; A45C 11/00; A45C 2200/10; H05K 5/0278; H05K 5/0252
USPC .................................................. 361/679.31
See application file for complete search history.

(56) References Cited

U.S. PATENT DOCUMENTS

| D313,500 S | 1/1991 | Chow |
| D345,463 S | 3/1994 | Sankey et al. |
| D357,409 S | 4/1995 | Past et al. |
| D365,892 S | 1/1996 | Markham |
| D397,869 S | 9/1998 | Minhas |
| D431,359 S | 10/2000 | Lapidus |
| D446,717 S | 8/2001 | Lancaster et al. |
| D447,334 S | 9/2001 | Williams |
| D490,977 S | 6/2004 | Freeman |
| D540,539 S | 4/2007 | Gutierrez |
| D588,907 S | 3/2009 | Cesario, Jr. |
| D592,398 S | 5/2009 | Roesler |
| D612,152 S | 3/2010 | Roesler |
| D616,741 S | 6/2010 | Andre et al. |
| D617,987 S | 6/2010 | Wang |
| 7,774,969 B1 * | 8/2010 | Silverman ............... G09F 3/207 224/257 |

(Continued)

FOREIGN PATENT DOCUMENTS

GB      2492321 A  *  1/2013  ............. A45C 11/00

OTHER PUBLICATIONS

Amazon, "Litop Pack of 10 White Protective Protection Case Box for USB . . . ", First on sale Sep. 26, 2014. (https://www.amazon.com/ dp/B00NXSPD2Q/) (Year: 2014) (8 pages).

(Continued)

*Primary Examiner* — Rockshana D Chowdhury
(74) *Attorney, Agent, or Firm* — Rothwell, Figg, Ernst & Manbeck, P.C.

(57) ABSTRACT

A system for storing and labeling a USB flash drive includes a container that is selectably openable and closeable, has an interior label and or one or more exterior labels, and has a tether for connecting the container to the USB flash drive. The container contains a lid that is openable to provide access to an interior space. The tether is flexible and connects to the container at one end and connects to the USB flash drive at a second end. The system may also include a storage rack for storing and organizing one or more containers for quick retrieval.

19 Claims, 11 Drawing Sheets

(56) References Cited

U.S. PATENT DOCUMENTS

| | | | | |
|---|---|---|---|---|
| 7,857,659 B2* | 12/2010 | Wang | ............... | G06F 1/16 |
| | | | | 439/501 |
| D633,507 S | 3/2011 | Nelson | | |
| 8,351,195 B2* | 1/2013 | Huang | ............... | G06F 1/1632 |
| | | | | 206/206 |
| D676,239 S | 2/2013 | Benoit et al. | | |
| D679,508 S | 4/2013 | Rivera | | |
| D690,934 S | 10/2013 | Robinson et al. | | |
| D691,036 S | 10/2013 | Sill | | |
| D706,129 S | 6/2014 | Boraczek et al. | | |
| D724,601 S | 3/2015 | Hsieh et al. | | |
| 9,380,702 B2 | 6/2016 | Fricker | ............... | H05K 7/1417 |
| D795,874 S | 8/2017 | Szeremeta et al. | | |
| D809,298 S | 2/2018 | Zhu | | |
| 2003/0080922 A1* | 5/2003 | Oross | ............... | G09F 3/0289 |
| | | | | 345/1.1 |
| 2004/0108710 A1* | 6/2004 | Hengsbach | ............... | B42D 3/00 |
| | | | | 281/29 |
| 2005/0227635 A1* | 10/2005 | Hawkins | ............... | G06F 1/1616 |
| | | | | 455/90.3 |
| 2009/0124104 A1* | 5/2009 | Zhu | ............... | G06K 19/07 |
| | | | | 439/131 |
| 2010/0122923 A1* | 5/2010 | Chin | ............... | B65D 75/22 |
| | | | | 206/307 |
| 2010/0164836 A1* | 7/2010 | Liberatore | ............... | G06F 1/1616 |
| | | | | 345/1.1 |
| 2011/0072700 A1* | 3/2011 | Theresa | ............... | G09F 3/10 |
| | | | | 40/638 |
| 2012/0206874 A1* | 8/2012 | Huang | ............... | H05K 5/0291 |
| | | | | 361/679.31 |
| 2012/0268064 A1* | 10/2012 | Ostrom | ............... | G06F 1/26 |
| | | | | 320/108 |
| 2014/0062390 A1* | 3/2014 | Webber | ............... | H02J 7/0027 |
| | | | | 320/107 |
| 2014/0064823 A1* | 3/2014 | Benefield | ............... | B42F 5/00 |
| | | | | 402/4 |
| 2014/0238878 A1* | 8/2014 | Henwood | ............... | H05K 5/0278 |
| | | | | 206/308.3 |
| 2015/0097008 A1* | 4/2015 | Adeyemi | ............... | A45F 5/004 |
| | | | | 224/162 |

OTHER PUBLICATIONS

B & H Photo Video, "Abundant Supply Company Unidentified Flashdrive Organizer Case (Clear)", Accessed Sep. 9, 2019. (https://www.bhphotovideo.com/c/product/1362793-REG/abundant_supply_company_01 clb_single_flash_drive_case. html) (Year: 2019) (3 pages).

Aliexpress, "5 Pieces New Rectangular USB Packaging . . . ", Accessed Sep. 9, 2019. (https://www.aliexpress.com/item/1280628871. html) (Year: 2019) (8 pages).

* cited by examiner

STORAGE AND LABELING SYSTEM FOR A USB FLASH DRIVE

FIELD OF THE DISCLOSURE

This disclosure relates to a storage and labeling system. In particular, the present invention may be used for storing and labeling a USB (Universal Serial Bus) flash drive.

BACKGROUND

As computer technology has evolved, external data storage devices have increased in data storage capacity while becoming more compact physically. Historically, external data storage devices have included, for example, floppy disks, laser discs, CD-ROMs, digital video discs (DVDs), and zip disks. In approximately the year 2000, the USB flash drive was introduced. The USB flash drive is preferred over prior external data storage devices because it has greater data storage capacity and speed, and because it is less prone to physical damage.

However, the USB flash drive has one distinct disadvantage over the prior external data storage devices, in that it is not easily labeled. The prior external data storage devices could be labeled on the face of the device. Due to the compact physical size of the USB flash drive, and its increased data storage capacity, the USB flash drive cannot be easily marked to identify the data contents of the drive. Another known disadvantage of external data storage devices generally is the ability to organize the devices for quick identification and accessibility.

The present invention seeks to solve both problems associated with the USB flash drive by providing for a system for storing and labeling a USB flash drive. The system includes a container for storing the USB flash drive, and a tether to attach the USB flash drive to the container so that the USB flash drive and the container are not easily separated, for example, while the USB flash drive is being used in a computer. The container may have one or more labels for indexing the USB flash drive and/or identifying the contents of the USB flash drive. The container is preferably a shape that can be easily stored in an organized fashion for quick retrieval. The system may further contain a rack for storing the containers so that each container and its contents are easily identified and retrieved.

SUMMARY

The following presents a simplified summary in order to provide a basic understanding of some aspects described herein. This summary is not an extensive overview of the claimed subject matter. It is intended to neither identify key or critical elements of the claimed subject matter nor delineate the scope thereof. Its sole purpose is to present some concepts in a simplified form as a prelude to the more detailed description that is presented later.

The present invention is a system for storing and labeling a USB flash drive having one or more labels for marking the data contents of the USB flash drive. The system includes a container for storing the USB flash drive. The container has an openable cover and an accessible interior space. The system also includes a tether that couples to the container at one end, and couples to the USB flash drive at the other end, so that the container and USB flash drive are physically connected and not easily separated. The container may contain a label that is adhered to a face of the accessible interior chamber, and that is extendable from the accessible interior chamber of the container. The container may have one or more labels on (an) exterior face(s) of the container for further marking and/or identification. A label may also be adhered to the USB flash drive so as to identify which container it should be stored in, in the event the USB flash drive becomes separated from its container.

Other features and characteristics of the subject matter of this disclosure, as well as the methods of operation, functions of related elements of structure and the combination of parts, and economies of manufacture, will become more apparent upon consideration of the following description and the appended claims with reference to the accompanying drawings, all of which form a part of this specification, wherein like reference numerals designate corresponding parts in the various figures.

BRIEF DESCRIPTION OF THE DRAWINGS

The accompanying drawings, which are incorporated herein and form part of the specification, illustrate various embodiments of the subject matter of this disclosure. In the drawings, like reference numbers indicate identical or functionally similar elements.

DETAILED DESCRIPTION

Figure 1:
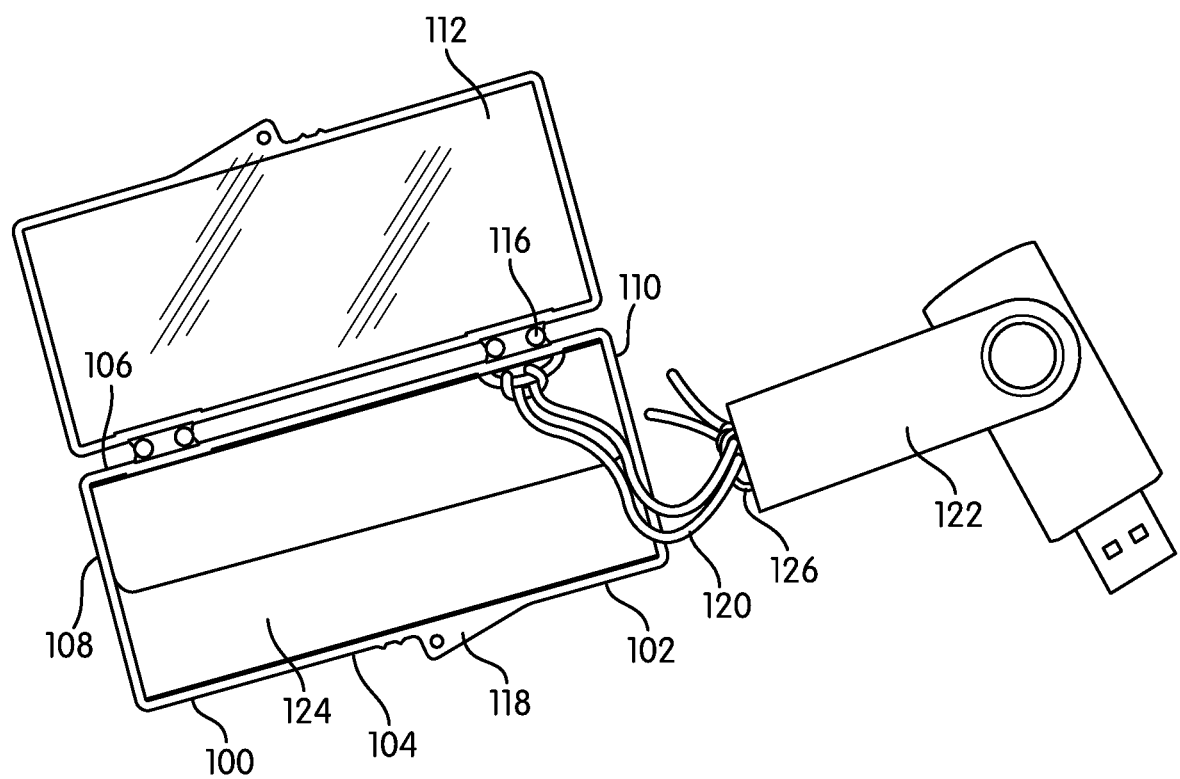
FIG. 1 is a top plan view of a USB storage and labeling system as disclosed herein.

While aspects of the subject matter of the present disclosure may be embodied in a variety of forms, the following description and accompanying drawings are merely intended to disclose some of these forms as specific examples of the subject matter. Accordingly, the subject matter of this disclosure is not intended to be limited to the forms or embodiments so described and illustrated.

Unless defined otherwise, all terms of art, notations and other technical terms or terminology used herein have the same meaning as is commonly understood by one of ordinary skill in the art to which this disclosure belongs.

Unless otherwise indicated or the context suggests otherwise, as used herein, "a" or "an" means "at least one" or "one or more."

This description may use relative spatial and/or orientation terms in describing the position and/or orientation of a component, apparatus, location, feature, or a portion thereof. Unless specifically stated, or otherwise dictated by the context of the description, such terms, including, without limitation, top, bottom, above, below, under, on top of, upper, lower, left of, right of, in front of, behind, next to, adjacent, between, horizontal, vertical, diagonal, longitudinal, transverse, radial, axial, etc., are used for convenience in referring to such component, apparatus, location, feature, or a portion thereof in the drawings and are not intended to be limiting.

Furthermore, unless otherwise stated, any specific dimensions mentioned in this description are merely representative of an exemplary implementation of a device embodying aspects of the disclosure and are not intended to be limiting.

A storage and labeling system 100 including a container 102 that is selectably openable and closeable, has an interior label 124 and/or one or more exterior labels 400, 500, and has a tether 120 for connecting the container 102 to a USB flash drive 122.

Figure 2:
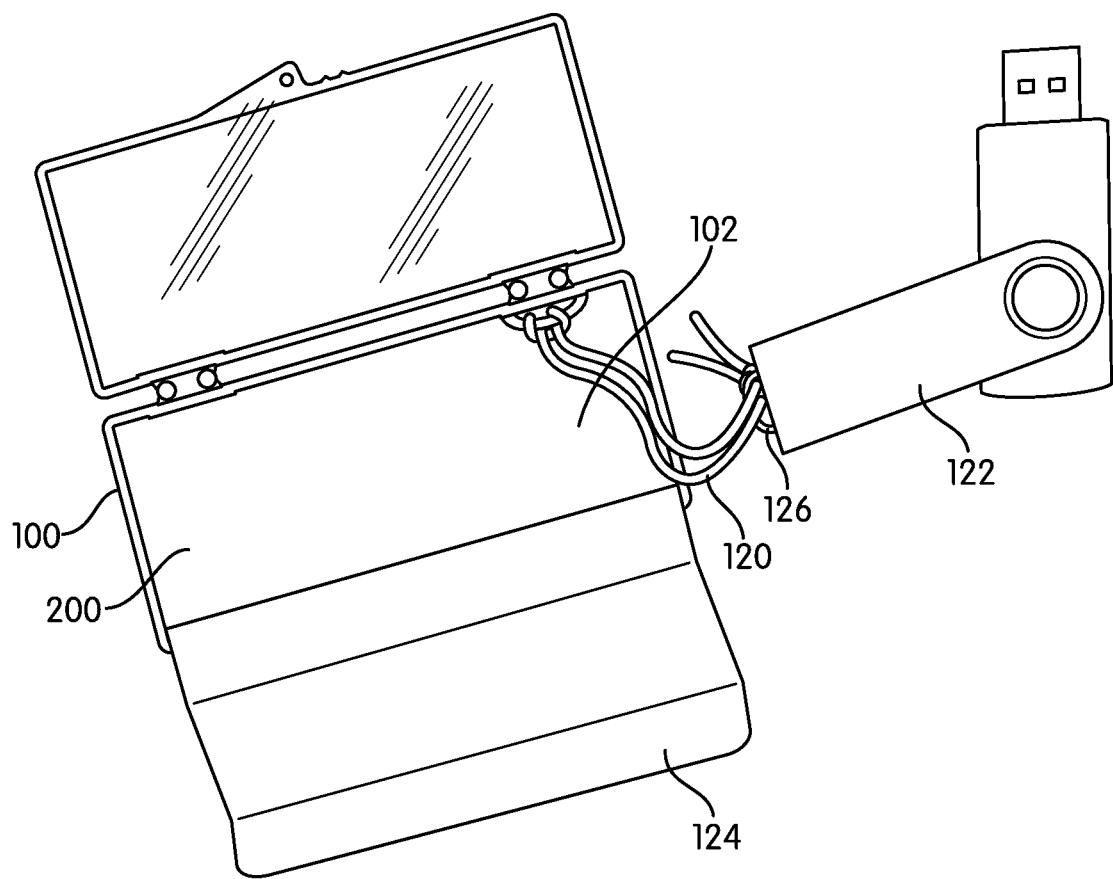
FIG. 2 is a top plan view of a USB storage and labeling system as disclosed herein.

The container may comprise a box having opposed side walls 104, 106, opposed end walls 108, 110, a top panel 112, and a bottom panel 200 that together define an accessible interior chamber, cavity, or space (as shown in FIGS. 1-2). One or more of the side walls, end walls, or top (as shown in FIG. 1) or bottom panels may be configured as a selectably openable and closeable lid 112. The lid 112 may be physically coupled to the container so that the lid is not detachable from the container.

Figure 3:
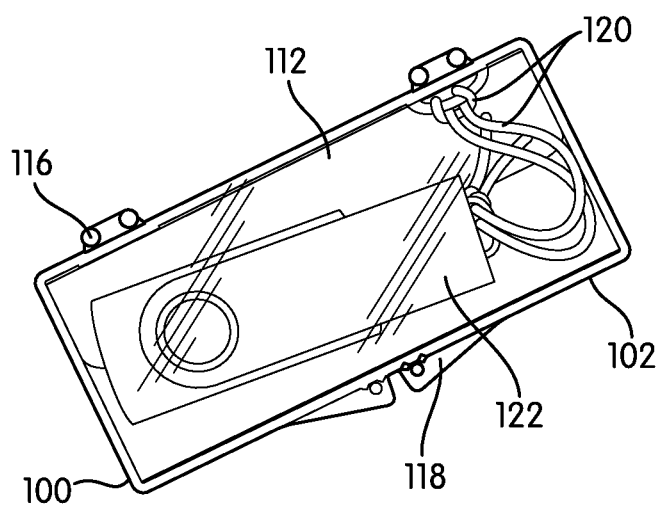
FIG. 3 is a top plan view of a USB storage and labeling system as disclosed herein.

As shown in the illustrated embodiment, the lid 112 may be connected to the container by one or more hinges 116 so that the lid 112 may be pivoted between an opened position (as shown in FIG. 1) and a closed position (as shown in FIG. 3). Alternatively, the lid may be slidable (not shown), such that the lid is slid within tracks or grooves between an opened position and a closed position. The slidable lid and/or container should have a stop component so that the lid does not become detached from the container when the lid is in the open position. In an alternate embodiment (not shown), the container may have opposed side walls 104, 106, opposed end walls 108, 110, and a bottom panel 200 but no top panel. In this embodiment, the container may be stored in a sleeve or jacket which has opposed side walls, a bottom panel, a top panel and optionally an end side wall, such that the container may be slid within the sleeve between an opened and closed position. The sleeve and/or container should have a stop component so that the sleeve and container do not become detached from one another.

The container 102 and/or lid 112 may have a clasp or latch 118 for releasably securing the lid 112 in a closed position (as shown in FIGS. 1 and 3). Additionally, the container 102, lid 112, and/or latch 118 may contain a lock (not shown) so as to restrict access to the interior of the container and the contents of the container.

The container 102 may be in the shape of a rectangular box (as shown in FIG. 1), or alternatively, may be cylindrical (not shown) or other oblong shape (not shown). For a cylindrical container (not shown), the lid may be threaded or otherwise rotated between an opened and closed position (e.g. a threaded cap that cooperates with mating threads on the cylindrical container). Alternatively, the cylindrical container may have a lid that is hingedly connected to the container so that it may be pivoted between an opened and closed position. The lid may be physically coupled to the container so that the lid and container do not become detached from one another. For a container of any shape, the size should be adequate to store a USB flash drive.

The container 102 may be made of a variety of materials, including (but not limited to) plastic, acrylic, glass, wood, or metal. The container may be rigid or malleable. The container 102 may be clear or, alternatively, may be of a wide variety of colors, either opaque or translucent. The lid 112 may be of the same material, color, and transparency as the container 102, or may be of a different material, color, or transparency as the container 102.

The storage and labeling system 100 also includes a flexible tether 120 for mechanically connecting the container 102 to a USB flash drive 122 (as shown in FIG. 1). At the first end, the tether 120 is fixedly or removably bonded to the container 102, such as by an adhesive, plastic welding, or a knot. The tether may be bonded to an exterior face or interior face of the container 102. The container 102 should contain, for example, a notch, groove, or hole (not shown) for the tether to pass through when the lid 112 is in the closed position. In an embodiment (not shown), the tether may be retractably coupled to the container, such as by a spring mechanism.

At the second end, the tether 120 is fixedly or removably coupled to an attachment-component 126 of a USB flash drive 122 (as shown in FIG. 1). Standard USB flash drives often contain an attachment-component 126 such as a loop, bar, or ring to be used to couple the USB to, for example, a keyring or lanyard. The storage and labeling system 100 may optionally include an attachable loop (not shown) to be used on a USB flash drive that does not contain an attachment-component. The attachable loop may be, for example, adhesively backed, to attach the loop to the USB flash drive so that the tether may be secured to the attachable loop.

Figure 6:
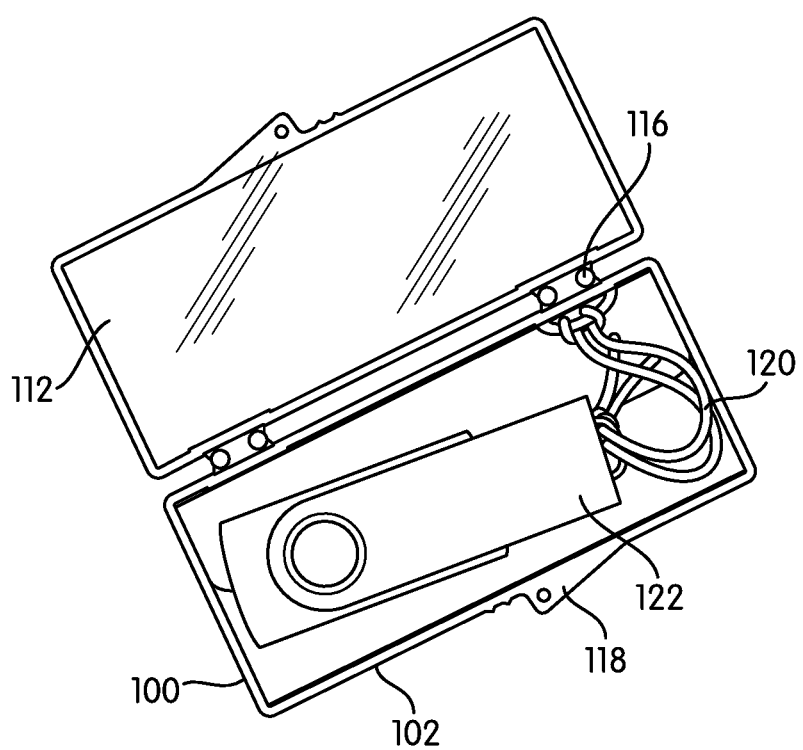
FIG. 6 is a top plan view of a USB storage and labeling system as disclosed herein.
Figure 7:
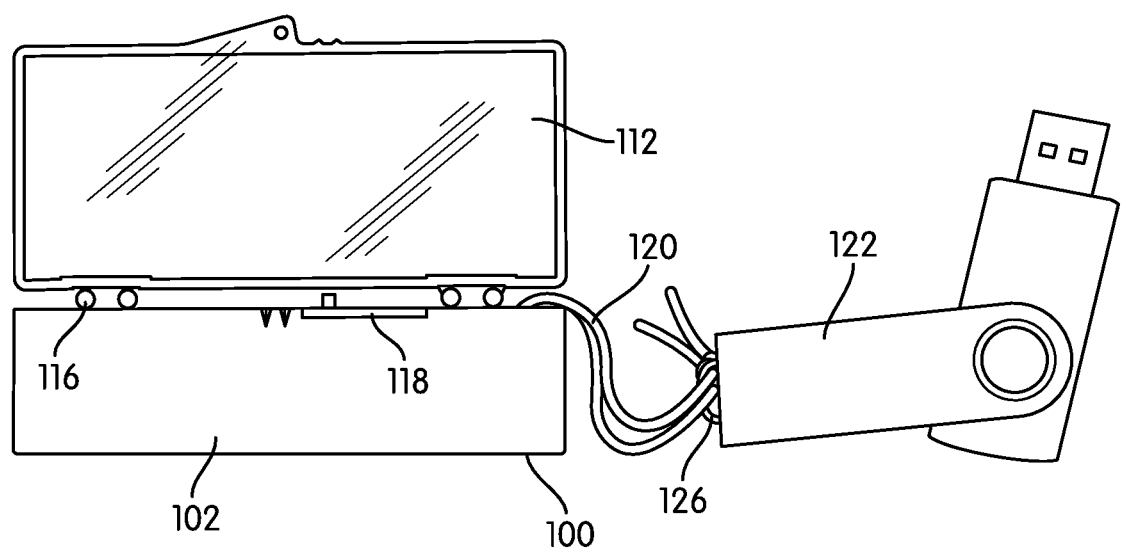
FIG. 7 is a side view of a USB storage and labeling system as disclosed herein.

The length of the tether 120 should allow for a range of movement so that the USB flash drive 122 may be used for its intended purpose and remain attached to the container 102. For example, the USB flash drive may be plugged into a computer (e.g. desktop, laptop, kiosk), yet still remain connected to the container via the tether. The tether 120 should be long enough that the container can be placed (or hang or dangle) at a convenient distance from the plugged-in USB flash drive without interfering with the insertion or removal of the flash drive or with other use of the computer. However, the length of the tether 120 should allow for the tether to be stored within the interior of the container when the USB flash drive 122 is stored within the container 102 and the lid 112 is in the closed position (as shown in FIG. 3). The tether 120 may be of any diameter, but should be of a diameter that allows for the tether to be coupled to the container and the attachment-component of the USB flash drive. The tether 120 may be made of a variety of materials, including (but not limited to) fabrics, polymers, rubbers, metals, coil, leather, plastic, vinyl, cotton string, nylon cord, cable, or chain. The tether 120 should be flexible or coilable to allow the tether to be stored within the interior space of the container 102 when the USB flash drive 122 is stored within the container 102 (as shown in FIGS. 3 and 6).

In various embodiments, the storage and labeling system 100 is intended to be used with a USB flash drive 122 (as shown in FIG. 1). The USB flash drive 122 may be of any brand (e.g. SanDisk®), and the body of the USB flash drive may be in a variety of shapes, including (but not limited to) rectangular, rounded rectangular, or other oblong shape. A USB flash drive might also be known as a memory stick, memory card, flash stick, keydrive, pendrive, thumbdrive, jumpdrive, or USB. In other embodiments, the storage and labeling system (not shown) may be used with a variety of other objects that share similar disadvantages as the USB flash drive, and would benefit from the aforementioned benefits of the storage and labeling system 100.

Figure 4:
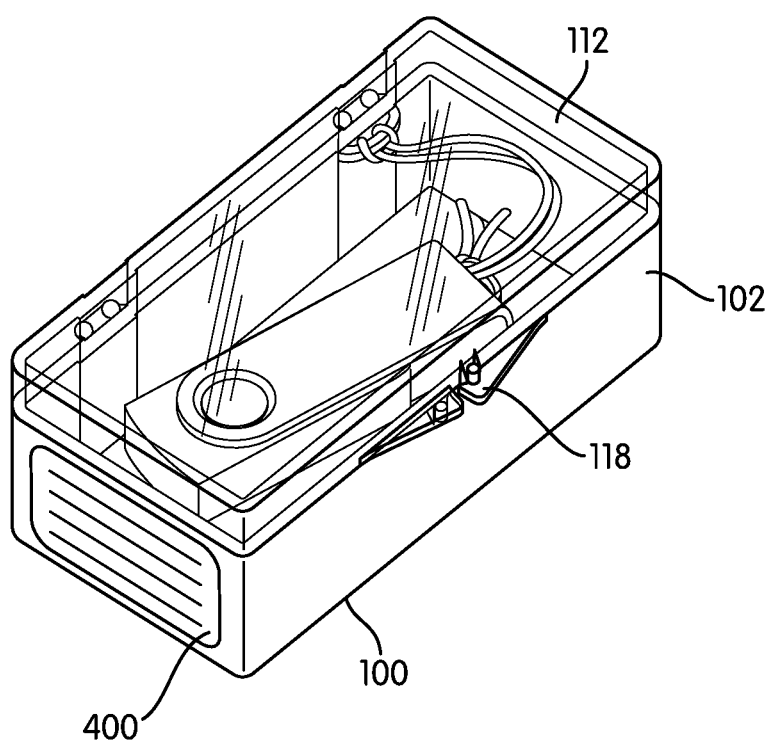
FIG. 4 is a top perspective view of a USB storage and labeling system as disclosed herein.
Figure 5:
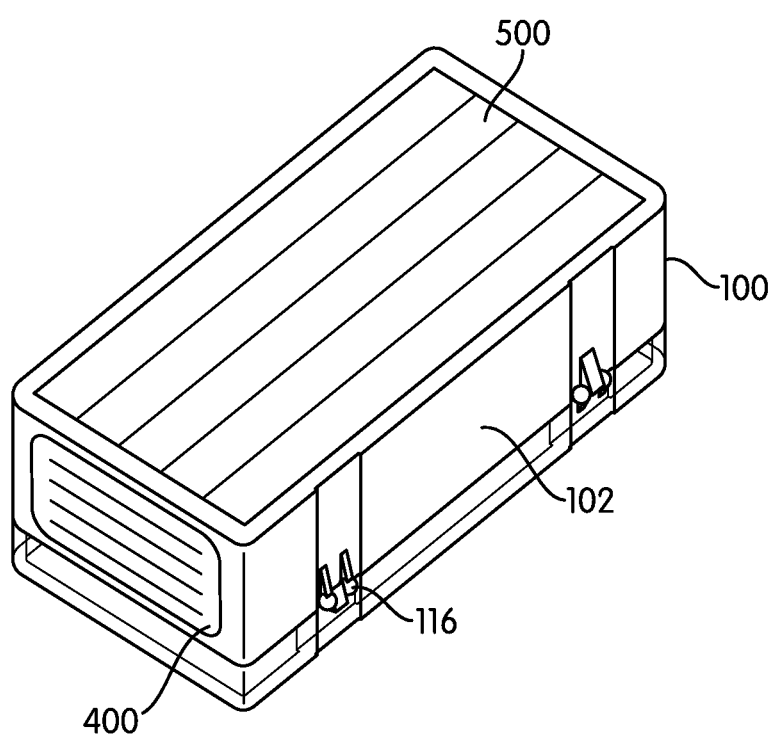
FIG. 5 is a bottom perspective view of a USB storage and labeling system as disclosed herein.
Figure 8:
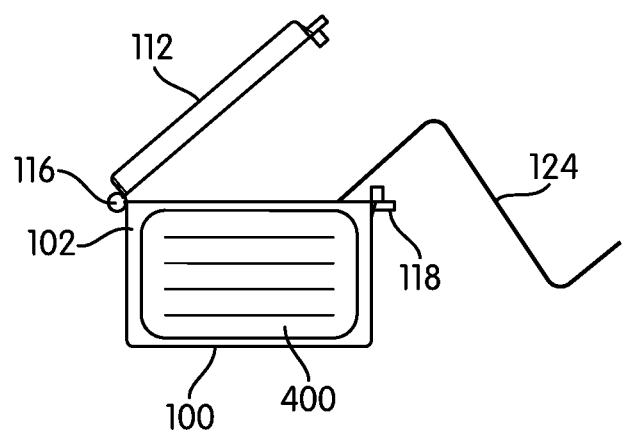
FIG. 8 is an end view of a USB storage and labeling system as disclosed herein.

The storage and labeling system 100 may contain various labels 124, 400, 500 for descriptive and/or identifying information (as shown in FIGS. 1, 4, and 5). In some embodiments, the system may contain an interior label 124 that is placed in the interior of the container 102, and may be secured to the interior of the container 102 to keep the interior label 124 and container 102 from being separated (as shown in FIG. 2). The interior label 124 may optionally be extendable such that the interior label can be folded, rolled, or otherwise stored compactly within the interior of the container 102 (as shown in FIG. 1) or may extend from the interior for easy notation and readability (as shown in FIGS. 2 and 8). The storage and labeling system 100 may also optionally include one or more labels on exterior surfaces of the container 102, such as an end surface label 400 (as shown in FIGS. 4, 5, 8) and a bottom surface label 500 (as shown in FIG. 5). In a further embodiment (not shown), the system may also include a label to be attached to the USB flash drive to identify its corresponding container in the event the USB flash drive and container become separated. The labels may be fixedly or removably adhered to the container by using a variety of adhesives, such as a permanent, semi-permanent, removable, or washable adhesive. The labels may be made of a variety of materials, including (but not limited to) paper or film.

Figure 9:
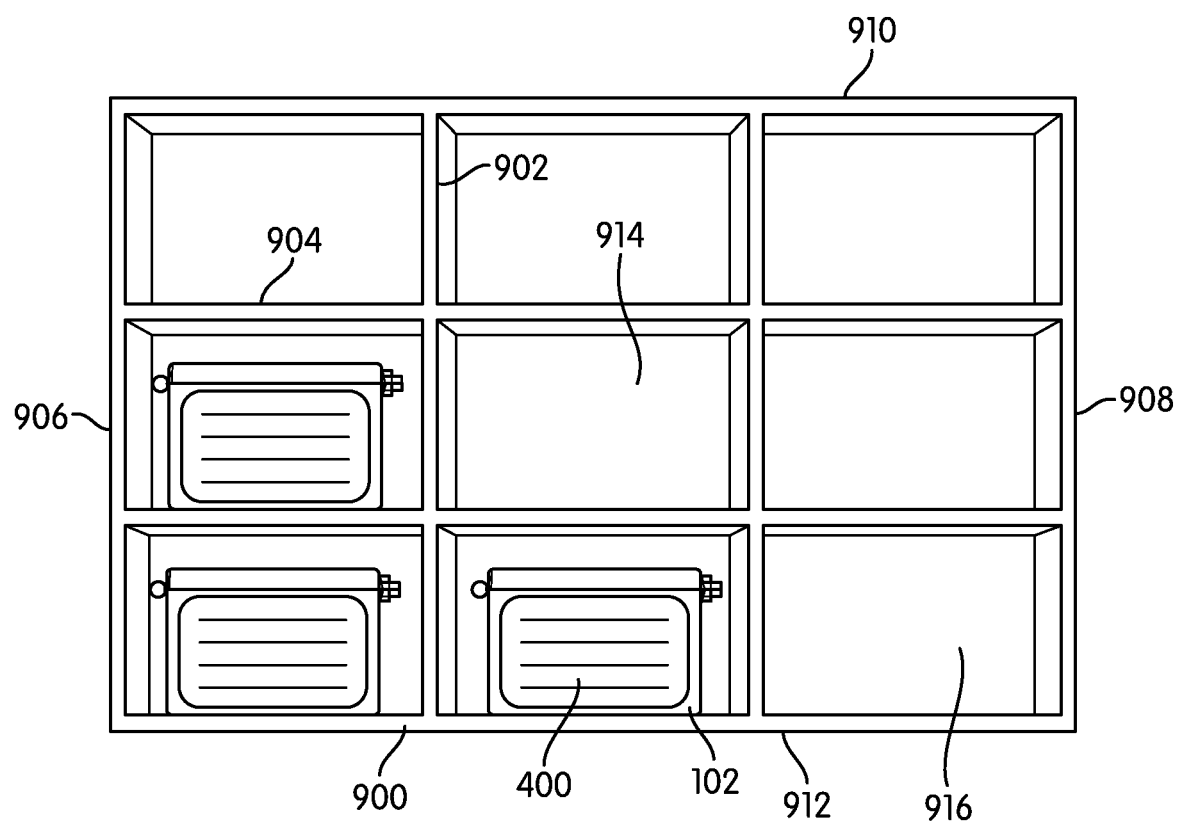
FIG. 9 is front view of a storage rack for storing the containers as disclosed herein.

The storage and labeling system 100 may optionally include a storage rack 900 defined by a series of storage compartments for storing one or more containers 102 for quick retrieval (as shown in FIG. 9). The storage rack may be a box with opposed side walls, 906, 908, a top panel 910, a bottom panel 912, and a back panel 914 that define the interior space of the storage rack. The storage rack may further contain vertical partitions 902 and horizontal partitions 904 to further subdivide the storage rack into separate compartments 916. The vertical partitions 902 and horizontal partitions 904 should be set at intervals to define a compartment size that is approximately equal to the width or length of the container 102. Alternatively, the storage rack 900 may be subdivided by vertical partitions (not shown) that contain grooves or tracks placed at intervals equal to the width or length of the container 102.

In other embodiments (not shown), the width of the storage rack may be the width or length of a single container and may only contain horizontal partitions to subdivide the storage rack into separate compartments.

Figure 10:
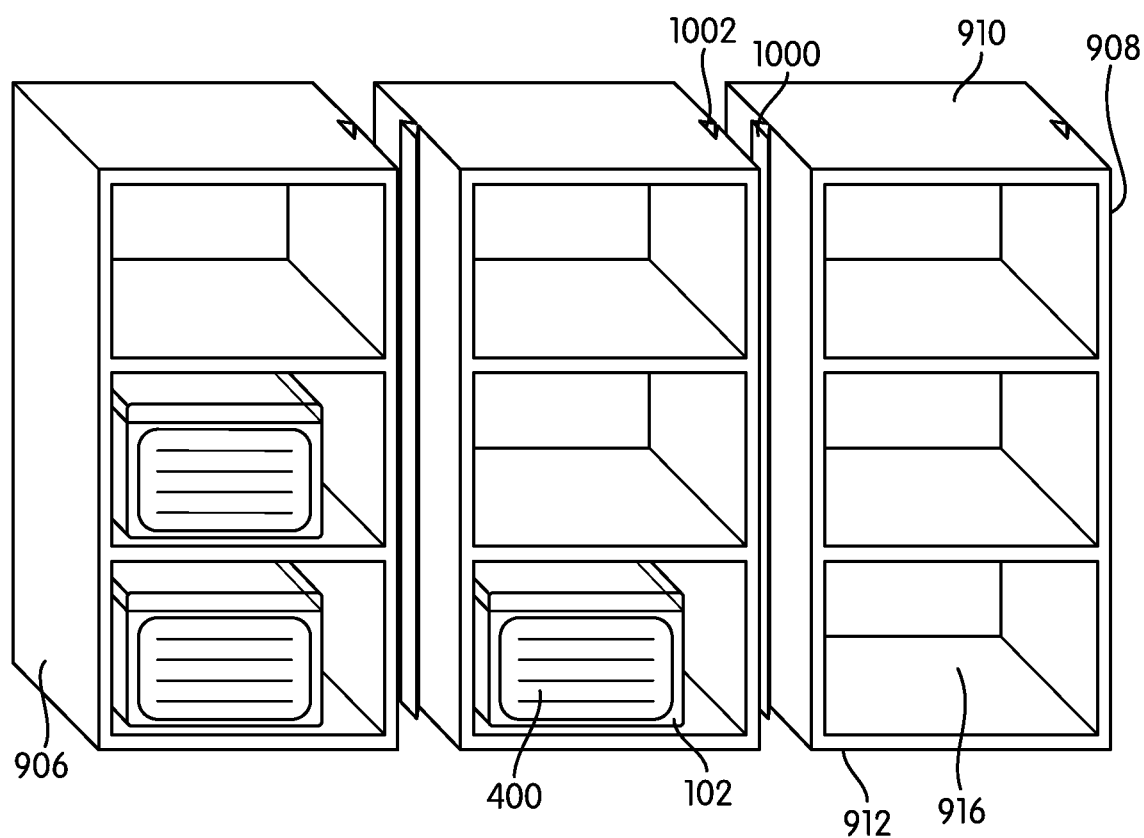
FIG. 10 is front perspective view of a modular storage rack configuration.
Figure 11:
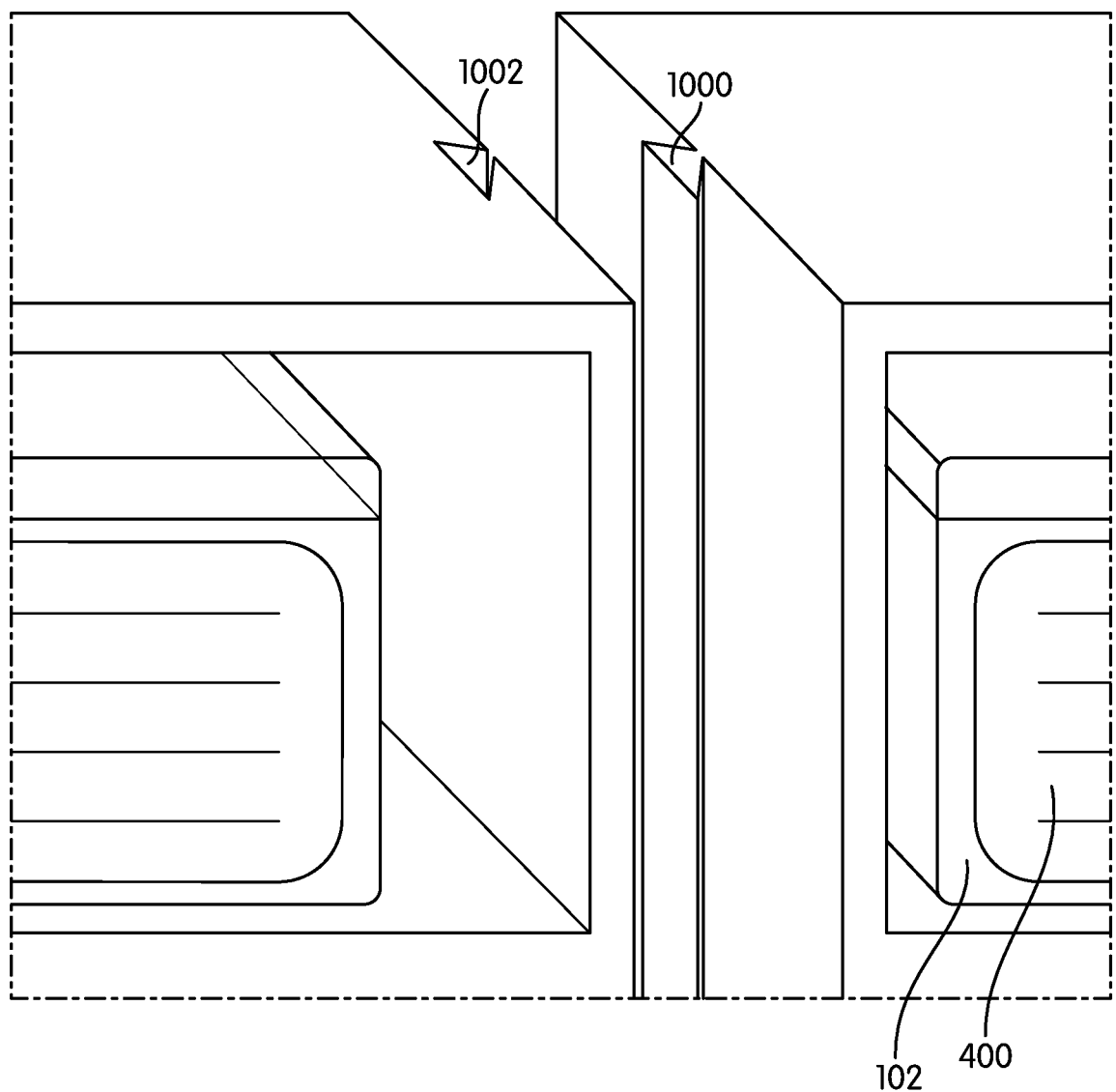
FIG. 11 is a partial, enlarged, front perspective view of a modular storage rack configuration showing connecting elements for connecting two storage rack modules together.

As shown in FIGS. 10 and 11, the storage racks may comprise individual modules configured to be connected to an adjacent, abutting module—permanently or non-permanently—and each including one or more compartments 916. In various embodiments, the modules have mating connecting elements located on abutting, interior sidewalls for connecting two adjacent storage rack modules together. For example, the connecting elements may comprise track 1000 extending for all or a portion of the height of the module that is slidably received within a conforming groove 1002 extending along all or a portion of the height of an abutting wall. In the illustrated embodiment of FIGS. 10 and 11, the track 1000 and groove 1002 have matching trapezoidal shapes, enabling the track 1000 to be slid longitudinally into the groove 1002 while preventing the connected modules from being separated from one another in a lateral direction. The track 1000 and groove 1002 thus interlock so that multiple single-width storage racks may be interconnected to create a multi-compartment-width storage rack.

Various fastener elements—e.g., screws, etc.—may be provided to supplement or replace the track and groove for holding abutting modules together.

The storage rack 900 may further contain a door (not shown) that is hingedly connected to an opposed side wall 906 so that the door may be openable and closeable. The door and/or storage rack (not shown) may further contain a lock so as to restrict access to the interior of the storage rack 900 and to the contents of the storage rack. In some embodiments, the storage rack may be rigidly attached to a vertical or horizontal surface (not shown) such that the storage rack is not easily removed from the wall. Alternatively, the storage rack may be placed on a shelf or in a drawer. In other embodiments, the storage rack may be portable, and may contain, for example, a handle or strap for convenient transport.

The storage rack 900 may be made of a variety of materials, including, but not limited to, wood, metal, plastic, cork, cardboard, acrylic or a combination of materials.

While the subject matter of this disclosure has been described and shown in considerable detail with reference to certain illustrative embodiments, including various combinations and sub-combinations of features, those skilled in the art will readily appreciate other embodiments and variations and modifications thereof as encompassed within the scope of the present disclosure. Moreover, the descriptions of such embodiments, combinations, and sub-combinations is not intended to convey that the claimed subject matter requires features or combinations of features other than those expressly recited in the claims. Accordingly, the scope of this disclosure is intended to include all modifications and variations encompassed within the spirit and scope of the following appended claims.

The invention claimed is:

1. A storage and labeling system for storing a USB flash drive comprising:
    a container defining an interior space configured to receive and contain the USB flash drive and having a lid configured to be selectably opened to provide access to the interior space or closed to secure the interior space;
    a flexible tether connected at one end to an interior portion of the container and configured to be connected at an opposite end to the USB flash drive, wherein the tether is configured to pass between the container and the lid when the lid is in the closed position and the USB flash drive, to which the opposite end of the tether is attached, is external to the interior space, and wherein the tether fits within the interior space of the container when the USB flash drive, to which the opposite end of the tether is attached, is within the interior space and the lid is closed; and
    a storage rack comprising two or more storage modules, wherein each storage module is configured to be removably attached to an adjacent, abutting storage module, and wherein each storage module includes two or more storage compartments, each storage compartment being configured to store one of the container.

2. The storage and labeling system of claim 1, wherein the lid is hingedly connected to the container, and is pivotably adjustable between an opened position and a closed position with respect to the interior space.

3. The storage and labeling system of claim 1, wherein the container comprises a rectangular box.

4. The storage and labeling system of claim 1, wherein the lid is transparent.

5. The storage and labeling system of claim 1, wherein the lid includes a clasp or latch for releasably securing the lid in a closed position.

6. The storage and labeling system of claim 1, wherein the tether is made of a material selected from the group consisting of fabric, polymer, rubber, metal, coil, leather, plastic, vinyl, cotton string, nylon cord, cable, or chain.

7. The storage and labeling system of claim 1, wherein the tether is configured to permit the USB flash drive to be inserted into a USB port of a computer while the container remains connected to the USB flash drive by the tether.

8. The storage and labeling system of claim 1, further comprising an attachable loop configured to adhere to the USB flash drive to provide an attachment-component to connect to the tether.

9. The storage and labeling system of claim 1, wherein each storage module comprises a connecting element on an abutting sidewall of the storage module configured to mate with a connecting element located on an abutting, adjacent storage module.

10. The storage and labeling system of claim 9, wherein the connecting elements comprise a track on one storage module and a groove on an adjacent storage module configured to receive the track.

11. The storage and labeling system of claim 1, wherein the tether is fixedly or removably bonded to the container by a knot.

12. The storage and labeling system of claim 1, further comprising a label having a portion secured to an interior surface of the container, wherein the label is configured to be selectively stored within the interior space of the container and extended from the interior space while remaining secured to the interior surface.

13. The storage and labeling system of claim 12, wherein the label is configured to be stored within the interior space of the container by folding or rolling the label.

14. The storage and labeling system of claim 1, wherein each storage module comprises a box with opposed side walls, a top panel, a bottom panel, and a back panel.

15. The storage and labeling system of claim 14, wherein each storage module further comprises horizontal partitions forming the storage compartments.

16. The storage and labeling system of claim 10, wherein the track and groove have matching trapezoidal shapes.

17. The storage and labeling system of claim 15, wherein a width of each storage compartment corresponds to a width of the container and wherein a depth of each storage compartment corresponds to a length of the container.

18. The storage and labeling system of claim 10, wherein the groove and the track extend along a least a portion of the height of a corresponding storage module, configuring the track to slide longitudinally into the groove.

19. The storage and labeling system of claim 1, wherein each of the storage compartments store one of a plurality of containers.

* * * * *